(12) United States Patent
Song et al.

(10) Patent No.: US 12,490,607 B2
(45) Date of Patent: Dec. 2, 2025

(54) DISPLAY APPARATUS AND METHOD OF INSPECTING DEFECTS OF THE SAME

(71) Applicant: Samsung Display Co., Ltd., Yongin-si (KR)

(72) Inventors: Jaejin Song, Yongin-si (KR); Sungmin Son, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 315 days.

(21) Appl. No.: 18/310,419

(22) Filed: May 1, 2023

(65) Prior Publication Data

US 2024/0138213 A1 Apr. 25, 2024
US 2024/0237436 A9 Jul. 11, 2024

(30) Foreign Application Priority Data

Oct. 25, 2022 (KR) .......... 10-2022-0138618

(51) Int. Cl.
*H10K 59/131* (2023.01)
*G06T 7/00* (2017.01)
*G09G 3/00* (2006.01)
*H10K 59/35* (2023.01)
*H10K 71/70* (2023.01)

(52) U.S. Cl.
CPC ......... *H10K 59/131* (2023.02); *G06T 7/0004* (2013.01); *G09G 3/006* (2013.01); *H10K 59/353* (2023.02); *H10K 71/70* (2023.02); *G09G 2300/0452* (2013.01); *G09G 2330/12* (2013.01)

(58) Field of Classification Search
USPC ........................................................ 382/141
See application file for complete search history.

(56) References Cited

U.S. PATENT DOCUMENTS

| | | | |
|---|---|---|---|
| 10,636,711 B2 | 4/2020 | Kim et al. | |
| 11,270,610 B2 | 3/2022 | Shim et al. | |
| 11,493,552 B2 | 11/2022 | Song et al. | |
| 2012/0161197 A1 | 6/2012 | Im et al. | |
| 2021/0225222 A1* | 7/2021 | Shim ............ | G09G 3/006 |
| 2021/0286002 A1* | 9/2021 | Song ............ | G09G 3/006 |

FOREIGN PATENT DOCUMENTS

| | | |
|---|---|---|
| KR | 10-1174884 B1 | 8/2012 |
| KR | 10-2265542 B1 | 6/2021 |
| KR | 10-2021-0084084 A | 7/2021 |
| KR | 10-2021-0095271 A | 8/2021 |
| KR | 10-2021-0114577 A | 9/2021 |

* cited by examiner

*Primary Examiner* — Jacky X Zheng
(74) *Attorney, Agent, or Firm* — Womble Bond Dickinson (US) LLP

(57) ABSTRACT

A display apparatus includes: a first column including blue pixels and red pixels alternately located along a first direction; a second column located in a second direction crossing the first direction from the first column, and including green pixels located along the first direction; a third column located in the second direction from the second column, and including red pixels and blue pixels alternately located along the first direction; a fourth column located in the second direction from the third column, and including green pixels located along the first direction; a first test data line extending in the second direction; a second test data line extending in the second direction; a third test data line extending in the second direction; and a fourth test data line extending in the second direction.

20 Claims, 7 Drawing Sheets

DISPLAY APPARATUS AND METHOD OF INSPECTING DEFECTS OF THE SAME

CROSS-REFERENCE TO RELATED APPLICATION

This application claims priority to and the benefit of Korean Patent Application No. 10-2022-0138618, filed on Oct. 25, 2022, in the Korean Intellectual Property Office, the entire disclosure of which is incorporated by reference herein.

BACKGROUND

1. Field

Aspects of one or more embodiments of the present disclosure relate to a display apparatus, and a method of checking for defects in the display apparatus.

2. Description of the Related Art

In general, a display apparatus includes a display area, and pixels located in the display area. Wirings for applying various electrical signals to the display area are located in the display area or a peripheral area, and the wirings are electrically connected to pads located in the peripheral area.

When there is a defect in a wiring or a pad in the display apparatus, the quality of an image displayed by the display apparatus may be degraded.

The above information disclosed in this Background section is for enhancement of understanding of the background of the present disclosure, and therefore, it may contain information that does not constitute prior art.

SUMMARY

It may be difficult to accurately or easily check for defects in a wiring or a pad of a display apparatus.

One or more embodiments of the present disclosure are directed to a display apparatus capable of accurately and easily checking for defects therein, and a method of checking for defects in the display apparatus.

However, the present disclosure is not limited to the above aspects and features. Additional aspects and features will be set forth, in part, in the description that follows, and in part, will be apparent from the description, or may be learned by practicing one or more of the presented embodiments of the present disclosure.

According to one or more embodiments of the present disclosure, a display apparatus includes: a first column including blue pixels and red pixels alternately located along a first direction; a second column including green pixels located along the first direction, the second column being located in a second direction crossing the first direction from the first column; a third column including red pixels and blue pixels alternately located along the first direction, the third column being located in the second direction from the second column; a fourth column including green pixels located along the first direction, the fourth column being located in the second direction from the third column; a fifth column including blue pixels and red pixels alternately located along the first direction, the fifth column being located in the second direction from the fourth column; a sixth column including green pixels located along the first direction, the sixth column being located in the second direction from the fifth column; a seventh column including red pixels and blue pixels alternately located along the first direction, the seventh column being located in the second direction from the sixth column; an eighth column including green pixels located along the first direction, the eighth column being located in the second direction from the seventh column; a first test data line extending in the second direction; a second test data line extending in the second direction; a third test data line extending in the second direction; and a fourth test data line extending in the second direction.

In an embodiment, the blue pixels of the first column may be electrically connected to the blue pixels of the third column; the red pixels of the third column may be electrically connected to the red pixels of the fifth column; and the blue pixels of the fifth column may be electrically connected to the blue pixels of the seventh column.

In an embodiment, the green pixels of the second column and the blue pixels of the third column may be electrically connected to the first test data line; the green pixels of the fourth column and the red pixels of the fifth column may be electrically connected to the second test data line; the green pixels of the sixth column and the blue pixels of the seventh column may be electrically connected to the third test data line; and the red pixels of the first column and the green pixels of the eighth column may be electrically connected to the fourth test data line.

In an embodiment, the display apparatus may further include: a first test transistor, one end of the first test transistor being electrically connected to the red pixels of the first column, and another end of the first test transistor being electrically connected to the fourth test data line; a second test transistor, one end of the second test transistor being electrically connected to the green pixels of the second column, and another end of the second test transistor being electrically connected to the first test data line; a third test transistor, one end of the third test transistor being electrically connected to the blue pixels of the third column, and another end of the third test transistor being electrically connected to the first test data line; a fourth test transistor, one end of the fourth test transistor being electrically connected to the green pixels of the fourth column, and another end of the fourth test transistor being electrically connected to the second test data line; a fifth test transistor, one end of the fifth test transistor being electrically connected to the red pixels of the fifth column, and another end of the fifth test transistor being electrically connected to the second test data line; a sixth test transistor, one end of the sixth test transistor being electrically connected to the green pixels of the sixth column, and another end of the sixth test transistor being electrically connected to the third test data line; a seventh test transistor, one end of the seventh test transistor being electrically connected to the blue pixels of the seventh column, and another end of the seventh test transistor being electrically connected to the third test data line; and an eighth test transistor, one end of the eighth test transistor being electrically connected to the green pixels of the eighth column, and another end of the eighth test transistor being electrically connected to the first test data line.

In an embodiment, gate electrodes of the first test transistor to the eighth test transistor may be electrically connected to each other.

In an embodiment, when an image is displayed in a display area, gate electrodes of the first test transistor to the eighth test transistor may be configured to be applied with a turn-off signal.

In an embodiment, the display apparatus may further include: a first pad electrically connected to the red pixels of the first column; a second pad electrically connected to the green pixels of the second column; a third pad electrically connected to the blue pixels of the third column; a fourth pad electrically connected to the green pixels of the fourth column; a fifth pad electrically connected to the red pixels of the fifth column; a sixth pad electrically connected to the green pixels of the sixth column; a seventh pad electrically connected to the blue pixels of the seventh column; and an eighth pad electrically connected to the green pixels of the eighth column.

In an embodiment, the first pad and the fifth pad may be located on a first virtual straight line extending in the second direction; the second pad and the sixth pad may be located on a second virtual straight line extending in the second direction; the third pad and the seventh pad may be located on a third virtual straight line extending in the second direction; and the fourth pad and the eighth pad may be located on a fourth virtual straight line extending in the second direction.

In an embodiment, the display apparatus may further include: a first connection line electrically connecting the red pixels of the first column to the first pad; a second connection line electrically connecting the green pixels of the second column to the second pad; a third connection line electrically connecting the blue pixels of the third column to the third pad; a fourth connection line electrically connecting the green pixels of the fourth column to the fourth pad; a fifth connection line electrically connecting the red pixels of the fifth column to the fifth pad; a sixth connection line electrically connecting the green pixels of the sixth column to the sixth pad; a seventh connection line electrically connecting the blue pixels of the seventh column to the seventh pad; and an eighth connection line electrically connecting the green pixels of the eighth column to the eighth pad.

In an embodiment, the first connection line, the third connection line, the fifth connection line, and the seventh connection line may be located on a first insulating layer; and the second connection line, the fourth connection line, the sixth connection line, and the eighth connection line may be located on a second insulating layer different from the first insulating layer.

According to one or more embodiments of the present disclosure, a method of checking for defects in a display apparatus, includes: preparing a display apparatus including: a first column including blue pixels and red pixels alternately located along a first direction; a second column located in a second direction crossing the first direction from the first column, and including green pixels located along the first direction; a third column located in the second direction from the second column, and including red pixels and blue pixels alternately located along the first direction, the blue pixels of the first column being electrically connected to the blue pixels of the third column; a fourth column located in the second direction from the third column, and including green pixels located along the first direction; a fifth column located in the second direction from the fourth column, and including blue pixels and red pixels alternately located along the first direction, the red pixels of the third column being electrically connected to the red pixels of the fifth column; a sixth column located in the second direction from the fifth column, and including green pixels located along the first direction; a seventh column located in the second direction from the sixth column, and including red pixels and blue pixels alternately located along the first direction, the blue pixels of the fifth column being electrically connected to the blue pixels of the seventh column; an eighth column located in the second direction from the seventh column, and including green pixels located along the first direction; a first test data line extending in the second direction, the green pixels of the second column and the blue pixels of the third column being electrically connected to the first test data line; a second test data line extending in the second direction, the green pixels of the fourth column and the red pixels of the fifth column being electrically connected to the second test data line; a third test data line extending in the second direction, the green pixels of the sixth column and the blue pixels of the seventh column being electrically connected to the third test data line; and a fourth test data line extending in the second direction, the red pixels of the first column and the green pixels of the eight column being electrically connected to the fourth test data line; applying a turn-on signal to the first test data line and the fourth test data line, and applying a turn-off signal to the second test data line and the third test data line; and analyzing an image of a display area to check for defects.

In an embodiment, the display apparatus may further include: a first test transistor, one end of the first test transistor being electrically connected to the red pixels of the first column, and another end of the first test transistor being electrically connected to the fourth test data line; a second test transistor, one end of the second test transistor being electrically connected to the green pixels of the second column, and another end of the second test transistor being electrically connected to the first test data line; a third test transistor, one end of the third test transistor being electrically connected to the blue pixels of the third column, and another end of the third test transistor being electrically connected to the first test data line; a fourth test transistor, one end of the fourth test transistor being electrically connected to the green pixels of the fourth column, and another end of the fourth test transistor being electrically connected to the second test data line; a fifth test transistor, one end of the fifth test transistor being electrically connected to the red pixels of the fifth column, and another end of the fifth test transistor being electrically connected to the second test data line; a sixth test transistor, one end of the sixth test transistor being electrically connected to the green pixels of the sixth column, and another end of the sixth test transistor being electrically connected to the third test data line; a seventh test transistor, one end of the seventh test transistor being electrically connected to the blue pixels of the seventh column, and another end of the seventh test transistor being electrically connected to the third test data line; and an eighth test transistor, one end of the eighth test transistor being electrically connected to the green pixels of the eighth column, and another end of the eighth test transistor being electrically connected to the first test data line. The applying of the turn-on signal and the turn-off signal may be performed in a state where the first test transistor to the eighth test transistor are turned on.

In an embodiment, gate electrodes of the first test transistor to the eighth test transistor may be electrically connected to each other.

In an embodiment, the display apparatus may further include: a first pad electrically connected to the red pixels of the first column; a second pad electrically connected to the green pixels of the second column; a third pad electrically connected to the blue pixels of the third column; a fourth pad electrically connected to the green pixels of the fourth column; a fifth pad electrically connected to the red pixels of the fifth column; a sixth pad electrically connected to the green pixels of the sixth column; a seventh pad electrically connected to the blue pixels of the seventh column; and an eighth pad electrically connected to the green pixels of the eighth column. The analyzing of the image may include checking to determine whether or not there is a short-circuit between at least two pads from among the first pad to the eighth pad.

In an embodiment, the first pad and the fifth pad may be located on a first virtual straight line extending in the second direction; the second pad and the sixth pad may be located on a second virtual straight line extending in the second direction; the third pad and the seventh pad may be located on a third virtual straight line extending in the second direction; the fourth pad and the eighth pad may be located on a fourth virtual straight line extending in the second direction; and the analyzing of the image may include checking to determine whether or not there is a short-circuit between pads located on a same virtual straight line in the second direction from among the first pad to the eight pad.

According to one or more embodiments of the present disclosure, a method of checking for defects in a display apparatus, includes: preparing a display apparatus including: a first column in which blue pixels and red pixels are alternately arranged along a first direction; a second column that is located in a second direction crossing the first direction from the first column, and in which green pixels are arranged along the first direction; a third column that is located in the second direction from the second column, and in which red pixels and blue pixels are alternately arranged along the first direction; a fourth column that is located in the second direction from the third column, and in which green pixels are arranged along the first direction; a fifth column that is located in the second direction from the fourth column, and in which blue pixels and red pixels are alternately arranged along the first direction; a sixth column that is located in the second direction from the fifth column, and in which green pixels are arranged along the first direction; a seventh column that is located in the second direction from the sixth column, and in which red pixels and blue pixels are alternately arranged along the first direction; an eighth column that is located in the second direction from the seventh column, and in which green pixels are arranged along the first direction; a first test data line extending in the second direction; a second test data line extending in the second direction; a third test data line extending in the second direction; and a fourth test data line extending in the second direction; applying a turn-on signal to the second test data line and the fourth test data line, and applying a turn-off signal to the first test data line and the third test data line; and analyzing an image of a display area to check for defects. The blue pixels of the first column are electrically connected to the blue pixels of the third column; the red pixels of the third column are electrically connected to the red pixels of the fifth column; the blue pixels of the fifth column are electrically connected to the blue pixels of the seventh column; the green pixels of the second column and the blue pixels of the third column are electrically connected to the first test data line; the green pixels of the fourth column and the red pixels of the fifth column are electrically connected to the second test data line; the green pixels of the sixth column and the blue pixels of the seventh column are electrically connected to the third test data line; and the red pixels of the first column and the green pixels of the eight column are electrically connected to the fourth test data line.

In an embodiment, the display apparatus may further include: a first test transistor having one end electrically connected to the red pixels of the first column, and another end electrically connected to the fourth test data line; a second test transistor having one end electrically connected to the green pixels of the second column, and another end electrically connected to the first test data line; a third test transistor having one end electrically connected to the blue pixels of the third column, and another end electrically connected to the first test data line; a fourth test transistor having one end electrically connected to the green pixels of the fourth column, and another end electrically connected to the second test data line; a fifth test transistor having one end electrically connected to the red pixels of the fifth column, and another end electrically connected to the second test data line; a sixth test transistor having one end electrically connected to the green pixels of the sixth column, and another end electrically connected to the third test data line; a seventh test transistor having one end electrically connected to the blue pixels of the seventh column, and another end electrically connected to the third test data line; and an eighth test transistor having one end electrically connected to the green pixels of the eighth column, and another end electrically connected to the first test data line. The applying of the turn-on signal and the turn-off signal may be performed in a state where the first test transistor to the eighth test transistor are turned on.

In an embodiment, gate electrodes of the first test transistor to the eighth test transistor may be electrically connected to each other.

In an embodiment, the display apparatus may further include: a first connection line electrically connecting the red pixels of the first column to a first pad; a second connection line electrically connecting the green pixels of the second column to a second pad; a third connection line electrically connecting the blue pixels of the third column to a third pad; a fourth connection line electrically connecting the green pixels of the fourth column to a fourth pad; a fifth connection line electrically connecting the red pixels of the fifth column to a fifth pad; a sixth connection line electrically connecting the green pixels of the sixth column to a sixth pad; a seventh connection line electrically connecting the blue pixels of the seventh column to a seventh pad; and an eighth connection line electrically connecting the green pixels of the eighth column to an eighth pad. The analyzing of the image may include checking to determine whether or not there is a short-circuit between at least two connection lines from among the first connection line to the eighth connection line.

In an embodiment, the first connection line, the third connection line, the fifth connection line, and the seventh connection line may be located on a first insulating layer; the second connection line, the fourth connection line, the sixth connection line, and the eighth connection line may be located on a second insulating layer different from the first insulating layer; and the analyzing of the image may include checking to determine whether or not there is a short-circuit between the first connection line, the third connection line, the fifth connection line, and the seventh connection line, or whether or not there is a short-circuit between the second connection line, the fourth connection line, the sixth connection line, and the eighth connection line.

The above and other aspects and features of the present disclosure will become more apparent from the detailed description, the drawings, and the claims and their equivalents.

BRIEF DESCRIPTION OF THE DRAWINGS

The above and other aspects and features of the present disclosure will be more clearly understood from the following detailed description of the illustrative, non-limiting embodiments with reference to the accompanying drawings, in which.

DETAILED DESCRIPTION

Figure 1:
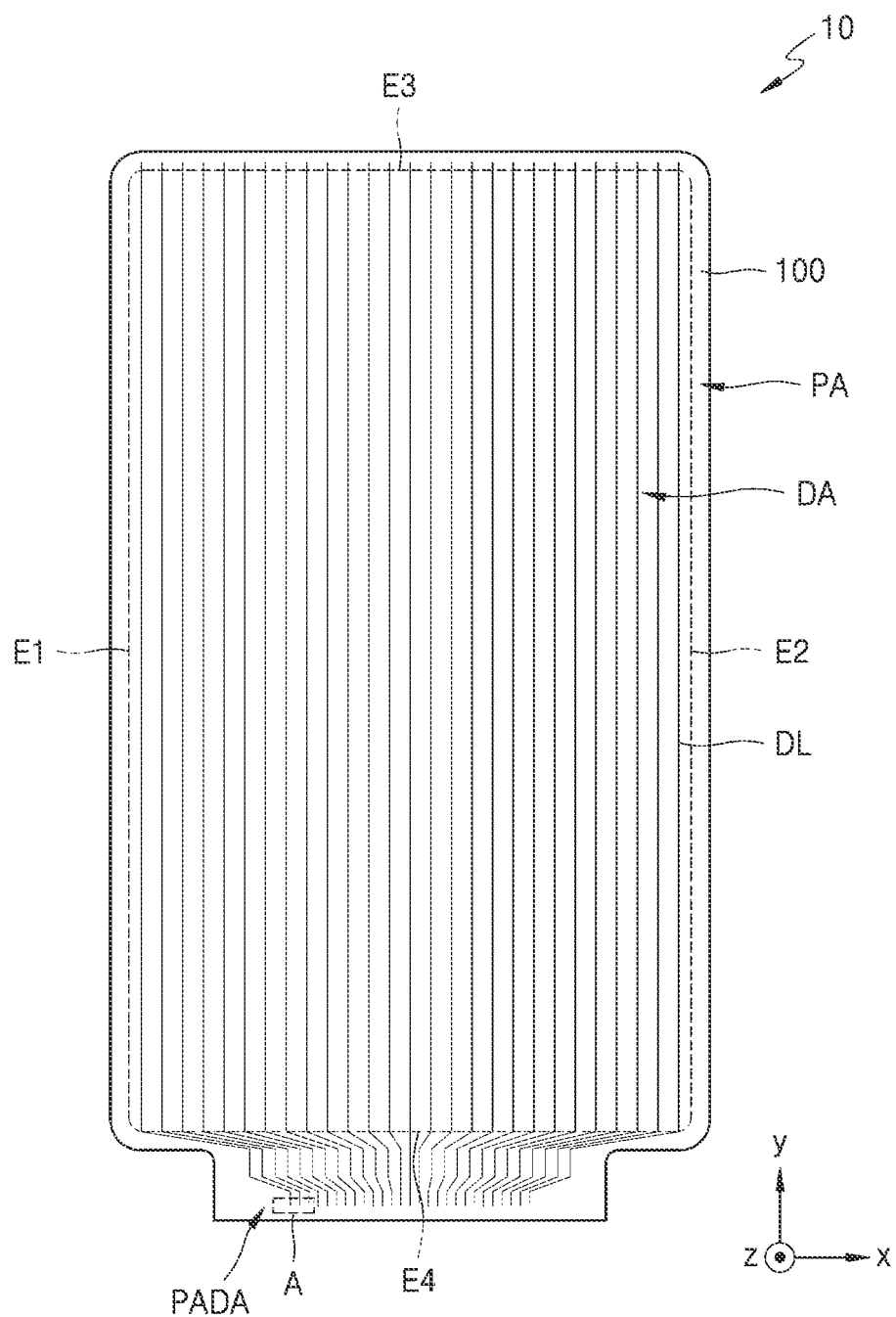
FIG. 1 is a conceptual view schematically illustrating a state during a process of manufacturing a display apparatus, according to an embodiment.

Hereinafter, embodiments will be described in more detail with reference to the accompanying drawings, in which like reference numbers refer to like elements throughout. The present disclosure, however, may be embodied in various different forms, and should not be construed as being limited to only the illustrated embodiments herein. Rather, these embodiments are provided as examples so that this disclosure will be thorough and complete, and will fully convey the aspects and features of the present disclosure to those skilled in the art. Accordingly, processes, elements, and techniques that are not necessary to those having ordinary skill in the art for a complete understanding of the aspects and features of the present disclosure may not be described. Unless otherwise noted, like reference numerals denote like elements throughout the attached drawings and the written description, and thus, redundant description thereof may not be repeated.

When a certain embodiment may be implemented differently, a specific process order may be different from the described order. For example, two consecutively described processes may be performed at the same or substantially at the same time, or may be performed in an order opposite to the described order.

In the drawings, the relative sizes, thicknesses, and ratios of elements, layers, and regions may be exaggerated and/or simplified for clarity. Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

In the figures, the x-axis, the y-axis, and the z-axis are not limited to three axes of the rectangular coordinate system, and may be interpreted in a broader sense. For example, the x-axis, the y-axis, and the z-axis may be perpendicular to or substantially perpendicular to one another, or may represent different directions from each other that are not perpendicular to one another.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

It will be understood that when an element or layer is referred to as being "on," "connected to," or "coupled to" another element or layer, it can be directly on, connected to, or coupled to the other element or layer, or one or more intervening elements or layers may be present. Similarly, when a layer, an area, or an element is referred to as being "electrically connected" to another layer, area, or element, it may be directly electrically connected to the other layer, area, or element, and/or may be indirectly electrically connected with one or more intervening layers, areas, or elements therebetween. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments and is not intended to be limiting of the present disclosure. As used herein, the singular forms "a" and "an" are intended to include the plural forms as well, unless the context clearly indicates otherwise. It will be further understood that the terms "comprises," "comprising," "includes," "including," "has," "have," and "having," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. For example, the expression "A and/or B" denotes A, B, or A and B. Expressions such as "at least one of," when preceding a list of elements, modify the entire list of elements and do not modify the individual elements of the list. For example, the expression "at least one of a, b, or c," "at least one of a, b, and c," and "at least one selected from the group consisting of a, b, and c" indicates only a, only b, only c, both a and b, both a and c, both b and c, all of a, b, and c, or variations thereof.

As used herein, the term "substantially," "about," and similar terms are used as terms of approximation and not as terms of degree, and are intended to account for the inherent variations in measured or calculated values that would be recognized by those of ordinary skill in the art. Further, the use of "may" when describing embodiments of the present disclosure refers to "one or more embodiments of the present disclosure." As used herein, the terms "use," "using," and "used" may be considered synonymous with the terms "utilize," "utilizing," and "utilized," respectively.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

FIG. 1 is a conceptual view schematically illustrating a state during a process of manufacturing a display apparatus, according to an embodiment.

As shown in FIG. 1, the display apparatus according to the present embodiment includes a display area DA in which a plurality of pixels are located, and a peripheral area PA outside the display area DA. A substrate 100 included in the display apparatus may include the display area DA and the peripheral area PA. The peripheral area PA includes a pad area PADA to which various electronic devices or printed circuit boards are electrically attached.

FIG. 1 may be a plan view illustrating the substrate 100 or the like during a manufacturing process. In an electronic device, such as a final display apparatus or a smartphone including a display apparatus, in order to minimize or reduce the area of the peripheral area PA that may be recognized by a user, a part of a substrate may be bent. For example, the peripheral area PA may include a bending area, and the bending area may be located between the pad area PADA and the display area DA. In this case, the substrate is bent in the bending area, so that at least a part of the pad area PADA overlaps with the display area DA. In this case, a bending direction is set, so that the pad area PADA is located behind (e.g., underneath) the display area DA rather than covering the display area DA. Accordingly, the user may recognize that the display area DA occupies most of the display apparatus.

The substrate 100 may include any of various suitable flexible or bendable materials. For example, the substrate 100 may include a polymer resin, such as polyethersulfone, polyacrylate, polyetherimide, polyethylene naphthalate, polyethylene terephthalate, polyphenylene sulfide, polyarylate, polyimide, polycarbonate, or cellulose acetate propionate. However, various modifications may be made. For example, the substrate 100 may have a multi-layered structure including two layers, each including a polymer resin, and a barrier layer including an inorganic material (e.g., silicon oxide, silicon nitride, or silicon oxynitride) and located between the two layers. Furthermore, when the substrate 100 is not bent, the substrate 100 may be formed of glass or the like.

The display area DA may have a substantially rectangular or square shape. However, as shown in FIG. 1, the display area DA may not have sharp corners. In more detail, the display area DA may include a first edge E1 and a second edge E2 that are opposite to each other, and a third edge E3 and a fourth edge E4 that are opposite to each other and located between the first edge E1 and the second edge E2. The pad area PADA may be adjacent to the fourth edge E4 from among the first edge E1 to the fourth edge E4. In this case, a portion connecting the first edge E1 and the fourth edge E4 to each other may have a rounded shape. A portion of the display area DA connecting the second edge E2 and the fourth edge E4 to each other may also have a rounded shape, and other portions of the display area DA may also have round or rounded shapes.

A plurality of data lines DL cross the display area DA, and extend to the peripheral area PA. Pixels in the display area DA may be electrically connected to a corresponding data line DL, and may emit light having a desired luminance (e.g., a specific or predetermined luminance) according to a signal from the data line DL to display an image in the display area DA.

Figure 2:
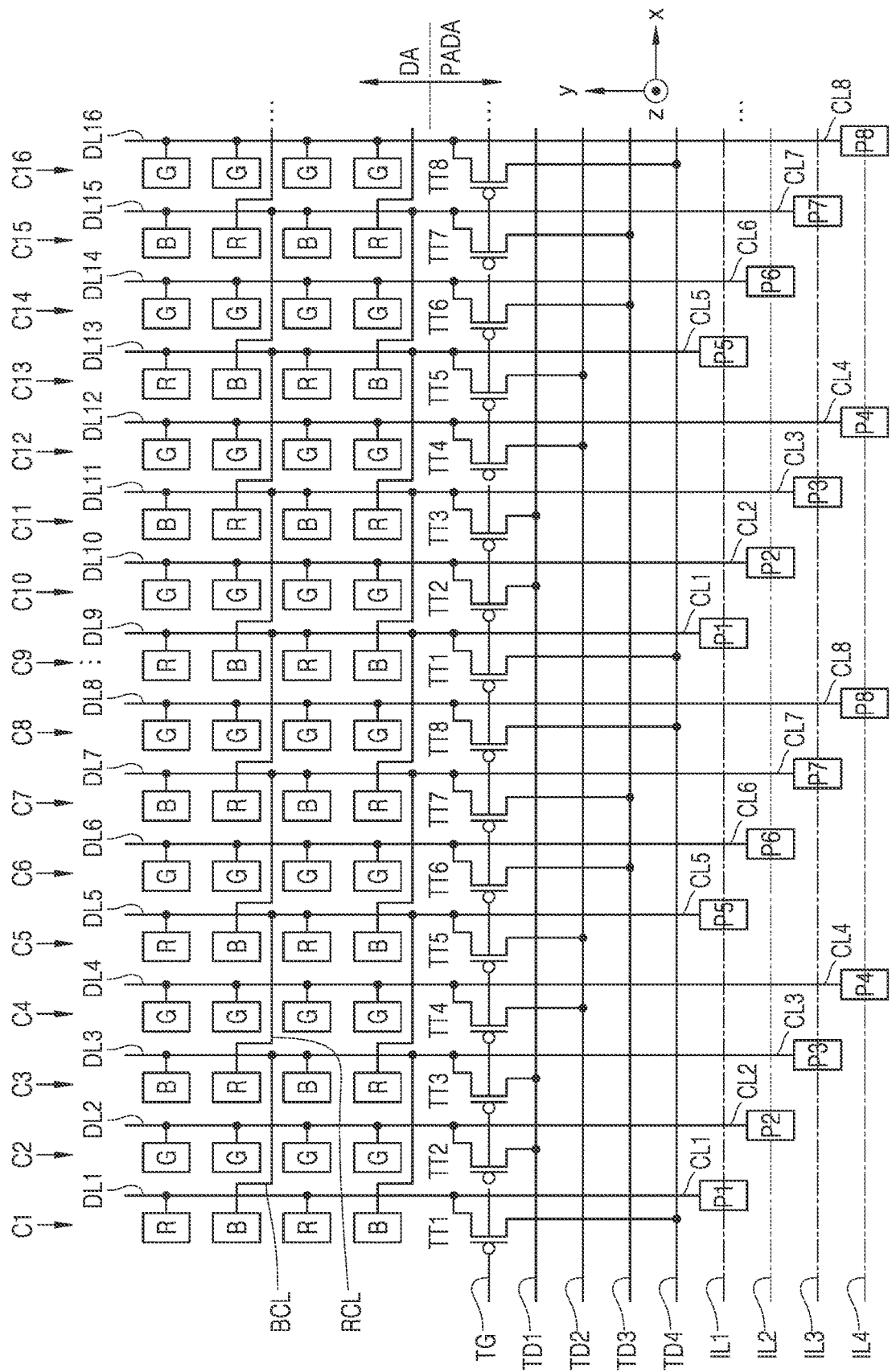
FIG. 2 is a conceptual diagram schematically illustrating the portion A of FIG. 1.

FIG. 2 is a conceptual diagram schematically illustrating the portion A of FIG. 1. As shown in FIG. 2, the display apparatus according to the present embodiment includes a plurality of test transistors (e.g., TT1 to TT8) located in the peripheral area PA, or in more detail, in the pad area PADA. The plurality of test transistors (e.g., TT1 to TT8) are test thin-film transistors for checking whether pixels of the display area DA normally operate in a manufacturing process.

A first column C1 to an eighth column C8, each extending in a first direction (+y direction), are located in the display area DA. The second column C2 may be located along a second direction (+x direction) from the first column C1. The third column C3 may be located along the second direction (+x direction) from the second column C2. The fourth column C4 may be located along the second direction (+x direction) from the third direction C3. The fifth column C5 may be located along the second direction (+x direction) from the fourth column C4. The sixth column C6 may be located along the second direction (+x direction) from the fifth column C5. The seventh column C7 may be located along the second direction (+x direction) from the sixth column C6. The eighth column C8 may be located along the second direction (+x direction) from the seventh column C7.

In the first column C1, blue pixels B and red pixels R may be alternately arranged along the first direction (+y direction). In the second column C2, green pixels G may be arranged along the first direction (+y direction). In the third column C3, red pixels R and blue pixels B may be alternately arranged along the first direction (+y direction). In the fourth column C4, green pixels G may be arranged along the first direction (+y direction). In the fifth column C5, blue pixels B and red pixels R may be alternately arranged along the first direction (+y direction). In the sixth column C6, green pixels G may be arranged along the first direction (+y direction). In the seventh column C7, red pixels R and blue pixels B may be alternately arranged along the first direction (+y direction). In the eighth column C8, green pixels G may be arranged along the first direction (+y direction).

In the peripheral area DA, or in more detail, in the pad area PADA, a first test data line TD1, a second test data line TD2, a third test data line TD3, and a fourth test data line TD4 may be located. The first test data line TD1, the second test data line TD2, the third test data line TD3, and the fourth test data line TD4 may each extend in the second direction (+x direction), and may be parallel to or substantially parallel to each other. The first test data line TD1, the second test data line TD2, the third test data line TD3, and the fourth test data line TD4 may be used to test whether the red pixels R, the green pixels G, and the blue pixels B of the display area DA normally operate, which will be described in more detail below.

The red pixels R of the first column C1 may be electrically connected to a first data line DL1 extending in the first direction (+y direction). The green pixels G of the second column C2 may be electrically connected to a second data line DL2 extending in the first direction (+y direction). The blue pixels B of the third column C3 may be electrically connected to a third data line DL3 extending in the first direction (+y direction). The green pixels G of the fourth column C4 may be electrically connected to a fourth data line DL4 extending in the first direction (+y direction). The red pixels R of the fifth column C5 may be electrically connected to a fifth data line DL5 extending in the first direction (+y direction). The green pixels G of the sixth column C6 may be electrically connected to a sixth data line DL6 extending in the first direction (+y direction). The blue pixels B of the seventh column C7 may be electrically connected to a seventh data line DL7 extending in the first direction (+y direction). The green pixels G of the eighth column C8 may be electrically connected to an eighth data line DL8 extending in the first direction (+y direction).

The blue pixels B of the first column C1 may be electrically connected to the third data line DL3, instead of to the first data line DL1, through a blue connection line BCL. In other words, the blue pixels B of the first column C1 may be electrically connected to the blue pixels B of the third column C3. The red pixels R of the third column C3 may be electrically connected to the fifth data line DL5, instead of to the third data line DL3, through a red connection line RCL. In other words, the red pixels R of the third column C3 may be electrically connected to the red pixels R of the fifth column C5. The blue pixels B of the fifth column C5 may be electrically connected to the seventh data line DL7, instead of to the fifth data line DL5, through the blue connection line BCL. In other words, the blue pixels B of the fifth column C5 may be electrically connected to the blue pixels B of the seventh column C7.

Because the blue connection line BCL and the red connection line RCL are used, when only a blue image is displayed or when only a red image is displayed in the display area DA, power consumption may be remarkably reduced. For example, when only a red image is displayed in the display area DA, because the red pixels R of the first column C1, the third column C3, the fifth column C5, and the seventh column C7 may emit light even though only the first data line DL1 and the fifth data line DL5 are used, power consumption may be reduced. Similarly, when only a blue image is displayed in the display area DA, because the blue pixels R of the first column C1, the third column C3, the fifth column C5, and the seventh column C7 may emit light even though only the third data line DL3 and the seventh data line DL7 are used, power consumption may be reduced.

As shown in FIG. 2, the green pixels G of the second column C2 and the blue pixels B of the third column C3 may be electrically connected to the first test data line TD1. In more detail, the second test transistor TT2 may have one end electrically connected to the green pixels G of the second column C2, or in other words, to the second data line DL2, and the other end electrically connected to the first test data line TD1. The third test transistor TT3 may have one end electrically connected to the blue pixels B of the third column C3, or in other words, to the third data line DL3, and the other end electrically connected to the first test data line TD1. The blue pixels B of the first column C1 may also be electrically connected to the one end of the third test transistor TT3 through the blue connection line BCL and the third data line DL3.

The green pixels G of the fourth column C4 and the red pixels R of the fifth column C5 may be electrically connected to the second test data line TD2. In more detail, the fourth test transistor TT4 may have one end electrically connected to the green pixels G of the fourth column C4, or in other words, to the fourth data line DL4, and the other end electrically connected to the second test data line TD2. The fifth test transistor TT5 may have one end electrically connected to the red pixels R of the fifth column C5, or in other words, to the fifth data line DL5, and the other end electrically connected to the second test data line TD2. The red pixels R of the third column C3 may also be electrically connected to the one end of the fifth test transistor TT5 through the red connection line RCL and the fifth data line DL5.

The green pixels G of the sixth column C6 and the blue pixels B of the seventh column C7 may be electrically connected to the third test data line TD3. In more detail, the sixth test transistor TT6 may have one end electrically connected to the green pixels G of the sixth column C6, or in other words, to the sixth data line DL6, and the other end electrically connected to the third test data line TD3. The seventh test transistor TT7 may have one end electrically connected to the blue pixels B of the seventh column C7, or in other words, to the seventh data line DL7, and the other end electrically connected to the third test data line TD3. The blue pixels B of the fifth column C5 may also be electrically connected to the one end of the seventh test transistor TT7 through the blue connection line BCL and the seventh data line DL7.

The red pixels R of the first column C1 and the green pixels G of the eighth column C8 may be electrically connected to the fourth test data line TD4.

In more detail, the first test transistor TT1 may have one end electrically connected to the red pixels R of the first column C1, or in other words, to the first data line DL1, and the other end electrically connected to the fourth test data line TD4. The eighth test transistor TT8 may have one end electrically connected to the green pixels G of the eighth column C8, or in other words, to the eighth data line DL8, and the other end electrically connected to the fourth test data line TD4.

Gate electrodes of the first test transistor TT1 to the eighth test transistor TT8 may be electrically connected to each other. As shown in FIG. 2, a test gate line TG may electrically connect the gate electrodes of the first test transistor TT1 to the eighth test transistor TT8 to each other. In more detail, the gate electrodes of the first test transistor TT1 to the eighth test transistor TT8 may be portions of the test gate line TG.

The first test transistor TT1 to the eighth test transistor TT8 may be used in (e.g., only in) an on-off test for testing whether the display area DA normally emits light in a process of manufacturing the display apparatus. When the display apparatus that is completely manufactured displays an image in the display area DA, a turn-off signal may be applied to the gate electrodes of the first test transistor TT1 to the eighth test transistor TT8, to prevent an incorrect signal from being applied to the first data line DL1 to the eighth data line DL8.

The display apparatus may include a first pad P1 to an eighth pad P8. The first pad P1 may be electrically connected to the red pixels R of the first column C1. In other words, the first pad P1 may be electrically connected to the first data line DL1. The second pad P2 may be electrically connected to the green pixels G of the second column C2. In other words, the second pad P2 may be electrically connected to the second data line DL2. The third pad P3 may be electrically connected to the blue pixels B of the first column C1 and the blue pixels B of the third column C3. In other words, the third pad P3 may be electrically connected to the third data line DL3. The fourth pad P4 may be electrically connected to the green pixels G of the fourth column C4. In other words, the fourth pad P4 may be electrically connected to the fourth data line DL4. The fifth pad P5 may be electrically connected to the red pixels R of the third column C3 and the red pixels R of the fifth column C5. In other words, the fifth pad P5 may be electrically connected to the fifth data line DL5. The sixth pad P6 may be electrically connected to the green pixels G of the sixth column C6. In other words, the sixth pad P6 may be electrically connected to the sixth data line DL6. The seventh pad P7 may be electrically connected to the blue pixels B of the fifth column C5 and the blue pixels B of the seventh column C7. In other words, the seventh pad P7 may be electrically connected to the seventh data line DL7. The eighth pad P8 may be electrically connected to the green pixels G of the eighth column C8. In other words, the eighth pad P8 may be electrically connected to the eighth data line DL8.

The first pad P1 to the eighth pad P8 may be arranged in a suitable manner. For example, as shown in FIG. 2, the first pad P1 and the fifth pad P5 may be located on a first virtual straight line IL1 extending in the second direction (+x direction). The second pad P2 and the sixth pad P6 may be located on a second virtual straight line IL2 extending in the second direction (+x direction). The third pad P3 and the seventh pad P7 may be located on a third virtual straight line IL3 extending in the second direction (+x direction). The fourth pad P4 and the eighth pad P8 may be located on a fourth virtual straight line IL4 extending in the second direction (+x direction).

All the pads may be located on one virtual straight line extending in the second direction (+x direction). However, as a resolution of the display area DA increases, and if the pads are located in this way (e.g., on one virtual straight line), an interval between the pads may be greatly reduced, and thus, a short-circuit may occur between adjacent pads, or a space for the pads may be insufficient. In the display apparatus according to the present embodiment, because the pads are distributed on the first virtual straight line IL1 to the fourth virtual straight line IL4 that are parallel to or substantially parallel to each other, even though a resolution of the display area DA increases, the probability of a short-circuit between the pads may be reduced.

The display apparatus may include a first connection line CL1 to an eighth connection line CL8, and the data lines may be electrically connected to the pads by the connection lines. In more detail, the first connection line CL1 may electrically connect the red pixels R of the first column C1 to the first pad P1. In other words, the first connection line CL1 may electrically connect the first data line DL1 to the first pad P1. The second connection line CL2 may electrically connect the green pixels G of the second column C2 to the second pad P2. In other words, the second connection line CL2 may electrically connect the second data line DL2 to the second pad P2. The third connection line CL3 may electrically connect the blue pixels B of the first column C1 and the third column C3 to the third pad P3. In other words, the third connection line CL3 may electrically connect the third data line DL3 to the third pad P3. The fourth connection line CL4 may electrically connect the green pixels G of the fourth column C4 to the fourth pad P4. In other words, the fourth connection line CL4 may electrically connect the fourth data line DL4 to the fourth pad P4. The fifth connection line CL5 may electrically connect the red pixels R of the third column C3 and the fifth column C5 to the fifth pad P5. In other words, the fifth connection line CL5 may electrically connect the fifth data line DL5 to the fifth pad P5. The sixth connection line CL6 may electrically connect the green pixels G of the sixth column C6 to the sixth pad P6. In other words, the sixth connection line CL6 may electrically connect the sixth data line DL6 to the sixth pad P6. The seventh connection line CL7 may electrically connect the blue pixels B of the fifth column C5 and the seventh column C7 to the seventh pad P7. In other words, the seventh connection line CL7 may electrically connect the seventh data line DL7 to the seventh pad P7. The eighth connection line CL8 may electrically connect the green pixels G of the eighth column C8 to the eighth pad P8. In other words, the eighth connection line CL8 may electrically connect the eighth data line DL8 to the eighth pad P8.

the first column C1 to the eighth column C8, and the elements electrically to the first column C1 to the eighth column C8, may be repeatedly arranged along the second direction (+x direction) crossing (e.g., intersecting) the first direction (+y direction). For example, in the case of the first column C1 to a $16^{th}$ column C16 arranged along the second direction (+x direction), the first column C1 and the first data line DL1 and the ninth column C9 and a ninth data line DL9 may have the same or similar configuration(s) as each other, the second column C2 and the second data line DL2 and the tenth column C10 and a tenth data line DL10 may have the same or similar configuration(s) as each other, the third column C3 and the third data line DL3 and the $11^{th}$ column C11 and an $11^{th}$ data line DL11 may have the same or similar configuration(s) as each other, the fourth column C4 and the fourth data line DL4 and the $12^{th}$ column C12 and a $12^{th}$ data line DL12 may have the same or similar configuration(s) as each other, the fifth column C5 and the fifth data line DL5 and the $13^{th}$ column C13 and a $13^{th}$ data line DL13 may have the same or similar configuration(s) as each other, the sixth column C6 and the sixth data line DL6 and the $14^{th}$ column C14 and a $14^{th}$ data line DL14 may have the same or similar configuration(s) as each other, the seventh column C7 and the seventh data line DL7 and the $15^{th}$ column C15 and a $15^{th}$ data line DL15 may have the same or similar configuration(s) as each other, and the eighth column C8 and the eighth data line DL8 and the $16^{th}$ column C16 and a $16^{th}$ data line DL16 may have the same or similar configuration(s) as each other. For example, the red pixels R of the seventh column C7 may be electrically connected to the ninth data line DL9, instead of to the seventh data line DL7, through the red connection line RCL. In other words, the red pixels R of the seventh column C7 may be electrically connected to the red pixels R of the ninth column C9.

A method of checking for defects in a display apparatus by inspecting whether or not there is a short-circuit between pads of the display apparatus will be described in more detail hereinafter with reference to FIGS. 3 and 4.

Figure 3:
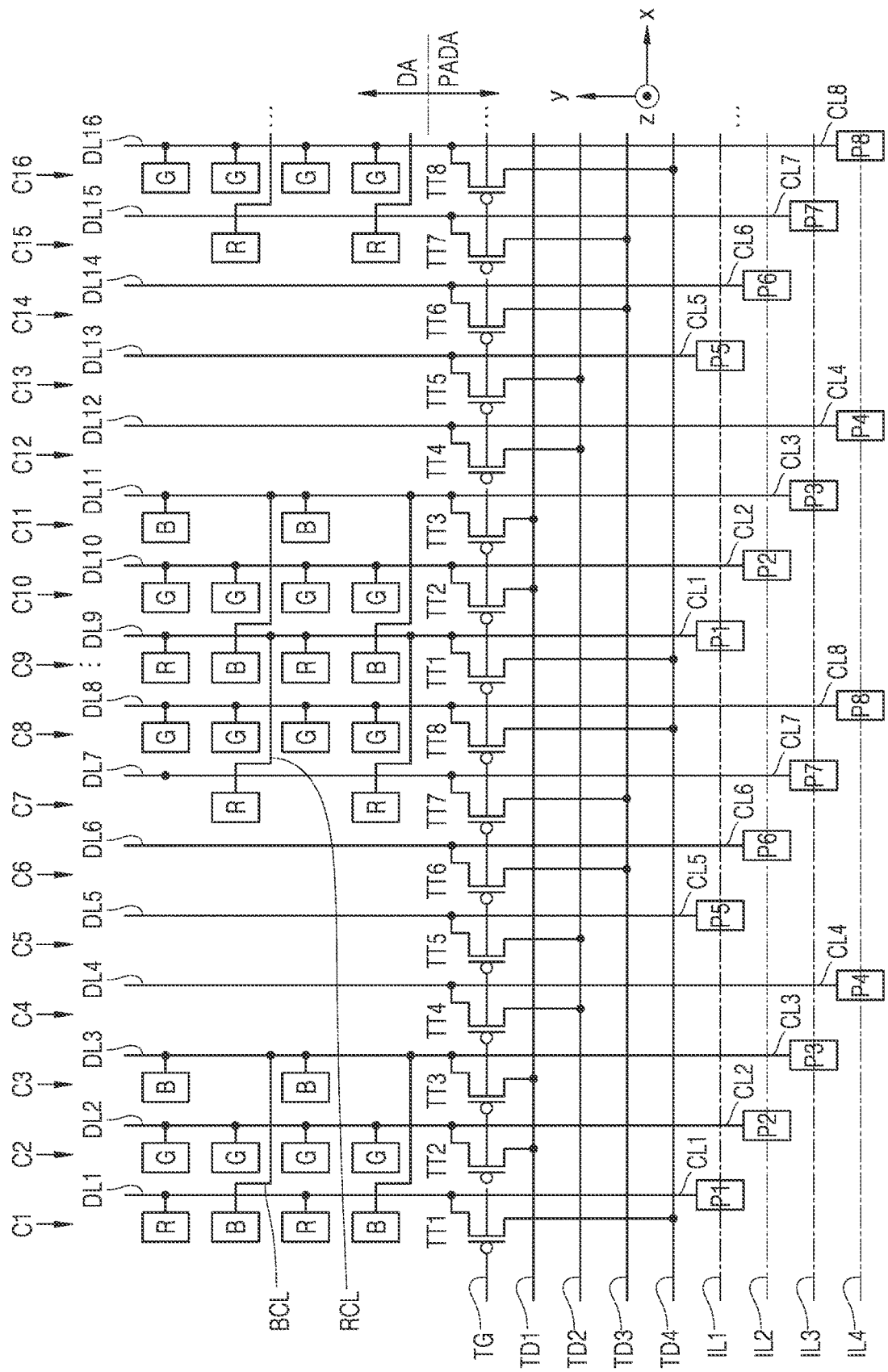
FIG. 3 is a conceptual diagram illustrating a case where the display apparatus of FIG. 1 normally operates when it is inspected to determine whether there is a short-circuit between pads of the display apparatus of FIG. 1.

FIG. 3 is a conceptual diagram illustrating a case where the display apparatus of FIG. 1 normally operates when it is inspected to determine whether there is a short-circuit between pads of the display apparatus of FIG. 1. In order to inspect to determine whether or not there is a short-circuit between the pads, a turn-on signal is applied to the test gate line TG to turn on the first test transistor TT1 to the eighth test transistor TT8. In this case, a signal application process is performed by applying a turn-on signal to the first test data line TD1 and the fourth test data line TD4, and applying a turn-off signal to the second test data line TD2 and the third test data line TD3.

When the signals are applied in this way, in a normal display apparatus, as shown in FIG. 3, the red pixels R of the seventh column C7, the green pixels G of the eighth column C8, the red pixels R and the blue pixels B of the ninth column C9, the green pixels G of the tenth column C10, and the blue pixels B of the 11$^{th}$ column C11 are turned on. Accordingly, a white line extending in the first direction (+y direction) is formed in a portion of the display area DA corresponding to the seventh column C7 to the 11$^{th}$ column C11. For reference, when one red pixel R, two green pixels G, and one blue pixel B are turned on, white light may be emitted. Also, when the signals are applied as described above, black lines extending in the first direction (+y direction) are formed in a portion of the display area DA corresponding to the fourth column C4 to the sixth column C6, and a portion of the display area DA corresponding to the 12$^{th}$ column C12 to the 14$^{th}$ column C14.

Therefore, in a normal display apparatus, white lines and black lines extending in the first direction (+y direction) are alternately formed along the second direction (+x direction). For reference, because the first column C1 to the third column C3 are the outermost columns of the display area DA in the second direction (+x direction), the number of red pixels R may be insufficient, and thus, an orange line may be formed instead of a white line.

Figure 4:
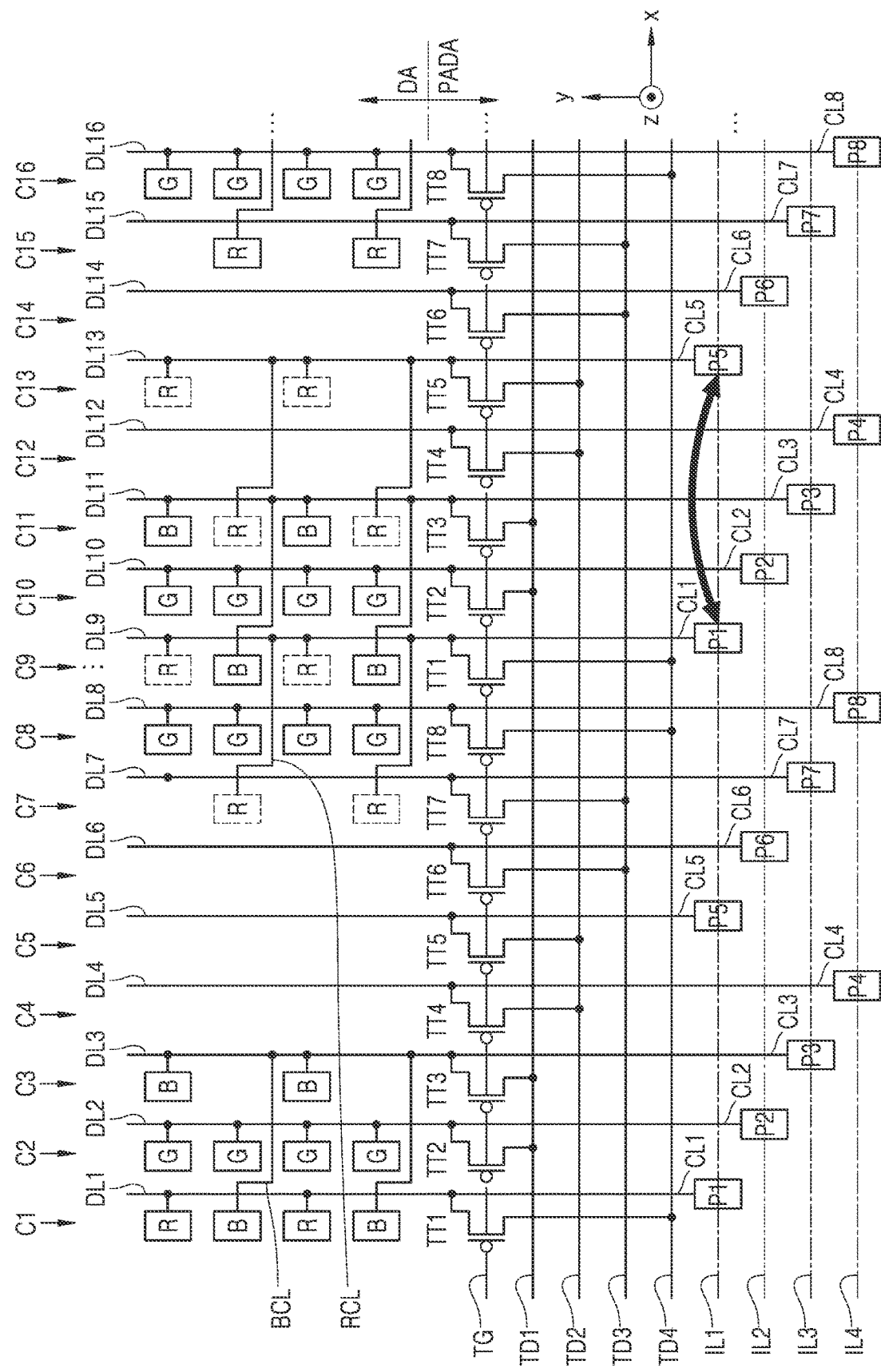
FIG. 4 is a conceptual diagram illustrating a case where the display apparatus of FIG. 1 abnormally operates due to a short-circuit when it is inspected to determine whether there is a short-circuit between pads of the display apparatus of FIG. 1.

FIG. 4 is a conceptual diagram illustrating a case where the display apparatus of FIG. 1 abnormally operates due to a short-circuit when it is inspected to determine whether there is a short-circuit between pads of the display apparatus of FIG. 1.

As described above, the first pad P1 and the fifth pad P5 may be located on the first virtual straight line IL1 extending in the second direction (+x direction). The second pad P2 and the sixth pad P6 may be located on the second virtual straight line IL2 extending in the second direction (+x direction). The third pad P3 and the seventh pad P7 may be located on the third virtual straight line IL3 extending in the second direction (+x direction). The fourth pad P4 and the eighth pad P8 may be located on the fourth virtual straight line IL4 extending in the second direction (+x direction).

Because the pads are arranged in this way, adjacent pads from among the pads located on the same virtual straight line may be short-circuited by impurities or the like during a manufacturing process. In FIG. 4, a case where the first pad P1 of the ninth column C9 and the fifth pad P5 of the 13$^{th}$ column C13 located on the first virtual straight line IL1 are short-circuited by impurities or the like to be electrically connected to each other is illustrated with a black arrow.

In order to inspect to determine whether or not there is a short-circuit between pads as described above, a turn-on signal is applied to the test gate line TG to turn on the first test transistor TT1 to the eighth test transistor TT8. In this case, a signal application process is performed by applying a turn-on signal to the first test data line TD1 and the fourth test data line TD4, and applying a turn-off signal to the second test data line TD2 and the third test data line TD3.

Because the 13$^{th}$ data line DL13 of the 13$^{th}$ column C13 is electrically connected to the second test data line TD2 by the fifth test transistor TT5, the red pixels R of the 13$^{th}$ column C13 and the red pixels R of the 11$^{th}$ column C11 that are electrically connected to the 13$^{th}$ data line DL13 should not emit light in a normal case. However, when the first pad P1 of the ninth column C9 and the fifth pad P5 of the 13$^{th}$ column C13 are short-circuited, a turn-on signal from the fourth test data line TD4 that is electrically connected to the ninth data line DL9 of the ninth column C9 is transmitted to the 13$^{th}$ data line DL13 of the 13$^{th}$ column C13 through the ninth data line DL9, the first pad P1 of the ninth column C9, and the fifth pad P5 of the 13$^{th}$ column C13, and thus, the red pixels R of the 13$^{th}$ column C13 and the red pixels R of the 11$^{th}$ column C11 emit light. For reference, because a part of an electrical signal applied to the ninth data line DL9 of the ninth column C9 is transmitted to the 13$^{th}$ data line DL13 of the 13$^{th}$ column C13, a luminance of the red pixels R of the seventh column C7 and the red pixels R of the ninth column C9 that are electrically connected to the ninth data line DL9 is lower than that in a normal case, and a luminance of the red pixels R of the 13$^{th}$ column C13 and the red pixels R of the 11$^{th}$ column C11 that are electrically connected to the 13$^{th}$ data line DL13 is also lower than a luminance of the red pixels R of the first column C1 or the red pixels R of the 15$^{th}$ column C15.

As described with reference to FIG. 3, in a normal display apparatus, during an inspection process, white lines and black lines extending in the first direction (+y direction) are alternately formed along the second direction (+x direction). However, as described above with reference to FIG. 4, when a short-circuit occurs between pads, an orange line may be formed instead of a white line in the seventh column C7 to the 11$^{th}$ column C11, and a red line may be formed instead of a black line in the 12$^{th}$ column C12 to the 14$^{th}$ column C14. Accordingly, through a process of analyzing an image of a display area to check for defects, it may be reliably determined whether or not there is a short-circuit between at least two pads from among the pads.

Figure 5:
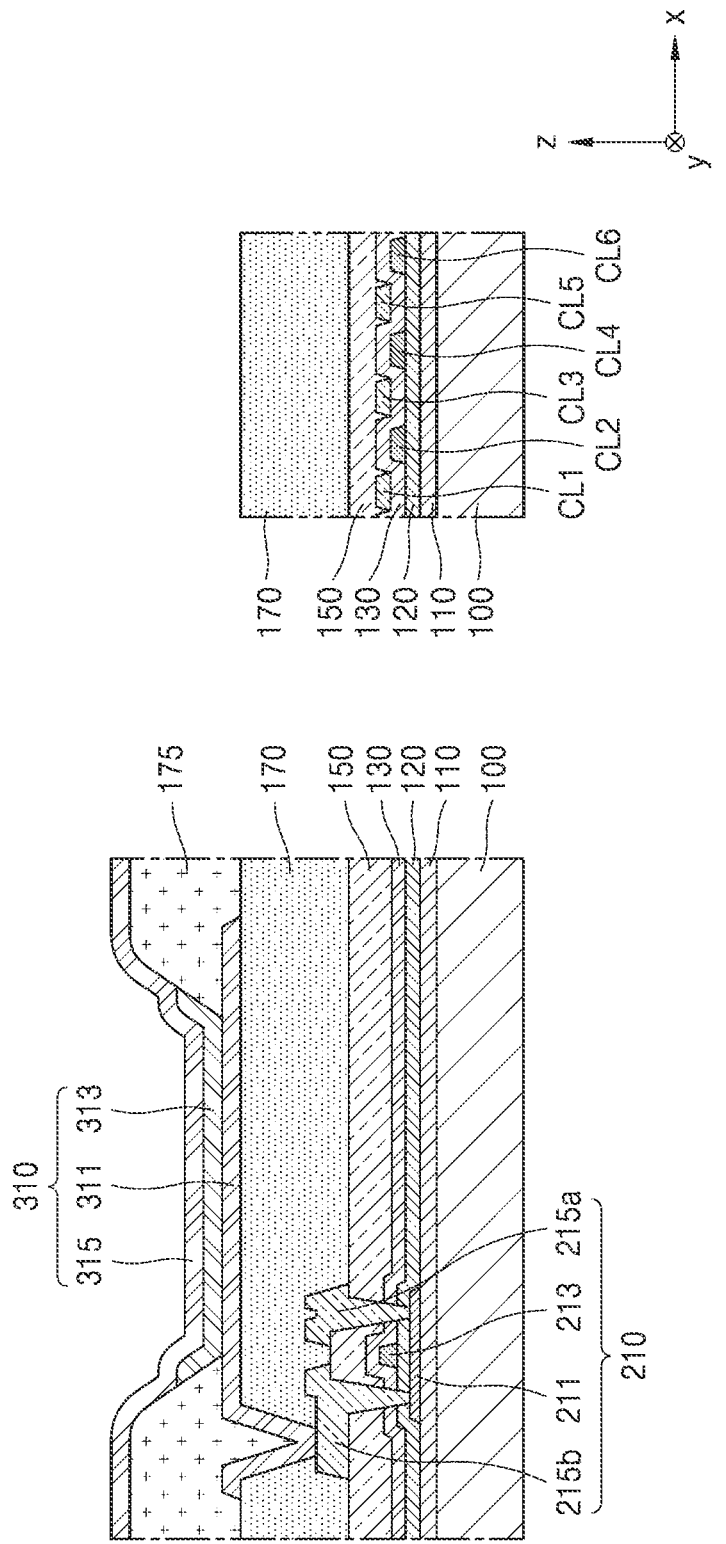
FIG. 5 is a cross-sectional view schematically illustrating a part of a display area and a part of a peripheral area of the display apparatus of FIG. 1.

FIG. 5 is a cross-sectional view schematically illustrating a part of a display area and a part of a peripheral area of the display apparatus of FIG. 1.

The first connection line CL1 to the eighth connection line CL8 described above do not overlap with each other in a plan view as shown in FIG. 2. In this case, in order to increase an interval between adjacent connection lines from among the first connection line CL1 to the eighth connection line CL8, the adjacent connection lines may be located at (e.g., in or on) different layers from each other as shown on the right side of FIG. 5. For example, the first connection line CL1, the third connection line CL3, the fifth connection line CL5, and the seventh connection line CL7 may be disposed on a first insulating layer, which may be a second gate insulating film 130 as described in more detail below, and the second connection line CL2, the fourth connection line CL4, the sixth connection line CL6, and the eighth connection line CL8 may be disposed on a second insulating layer, which may be a first gate insulating film 120 different from the first insulating layer. In FIG. 5, the second connection line CL2, the fourth connection line CL4, the sixth connection line CL6, and the eighth connection line CL8 are disposed on the second insulating layer that is the first gate insulating film 120. The first insulating layer that is the second gate insulating film 130 covers the second connection line CL2, the fourth connection line CL4, the sixth connection line CL6, and the eighth connection line CL8. The first connection line CL1, the third connection line CL3, the fifth connection line CL5, and the seventh connection line CL7 are disposed on the first insulating layer.

When the connection lines are located in this way, the connection lines that are adjacent to each other in a plan view are located at (e.g., in or on) different layers from each other. Accordingly, when an interval between the adjacent connection lines in a plan view is reduced, a short-circuit between the adjacent connection lines may be effectively prevented. As a result, even when a resolution of the display area DA increases, the probability of a short-circuit between adjacent connection lines may be reduced.

A left side of FIG. 5 shows a cross-sectional view schematically illustrating a part of a display area of the display apparatus of FIG. 1. A thin-film transistor 210 is located on the substrate 100 as shown in FIG. 5. The thin-film transistor 210 may include a semiconductor layer 211, a gate electrode 213, a source electrode 215a, and a drain electrode 215b. The semiconductor layer 211 may include amorphous silicon, polycrystalline silicon, an oxide semiconductor material, or an organic semiconductor material.

The thin-film transistor 210 includes the gate electrode 213. The gate electrode 213 may include a suitable metal, such as molybdenum or aluminum, and may have a single-layer or multi-layered structure. When the gate electrode 213 has a multi-layered structure, the gate electrode 213 may have a three-layered structure including molybdenum/aluminum/molybdenum. In order to ensure insulation between the gate electrode 213 and the semiconductor layer 211, the first gate insulating film 120 including an inorganic material, such as silicon oxide, silicon nitride, and/or silicon oxynitride, may be located between the gate electrode 213 and the semiconductor layer 211. The first gate insulating film 120 may be the second insulating layer as described above.

The gate electrode 213 may be covered by the second gate insulating film 130 as shown in FIG. 5. When desired, the gate electrode 213 may be located above the second gate insulating film 130, instead of between the first gate insulating film 120 and the second gate insulating film 130. This applies to the following embodiments and modifications thereof. For convenience, the gate electrode 213 will be described in more detail hereinafter as being located between the first gate insulating film 120 and the second gate insulating film 130. The second gate insulating film 130 may also include an inorganic material, such as silicon oxide, silicon nitride, and/or silicon oxynitride. The second gate insulating film 130 may be the first insulating layer as described above.

An interlayer insulating film 150 including an inorganic material, such as silicon oxide, silicon nitride, and/or silicon oxynitride, may be located on the gate electrode 213 and the second gate insulating film 130. The source electrode 215a and the drain electrode 215b included in the thin-film transistor 210 may be located on the interlayer insulating film 150. Each of the source electrode 215a and the drain electrode 215b may include a suitable metal, such as titanium, copper, or aluminum, and may have a single-layer or multi-layered structure. When each of the source electrode 215a and the drain electrode 215b has a multi-layered structure, each of the source electrode 215a and the drain electrode 215b may have a three-layered structure including titanium/aluminum/titanium. Various modifications may be made. For example, the thin-film transistor 210 may include only one of the source electrode 215a or the drain electrode 215b.

An insulating film including an inorganic material, such as the first gate insulating film 120, the second gate insulating film 130, and/or the interlayer insulating film 150, may be formed through chemical vapor deposition (CVD) or atomic layer deposition (ALD). This applies to the following embodiments and modifications thereof.

A buffer layer 110 including an inorganic material, such as silicon oxide, silicon nitride, and/or silicon oxynitride, may be located between the thin-film transistor 210 and the substrate 100. The buffer layer 110 may planarize or substantially planarize a top surface of the substrate 100, or may prevent or reduce impurities from the substrate 100 or the like from penetrating into the semiconductor layer 211 of the thin-film transistor 210.

A display device (e.g., a light-emitting device) may be located in the display area DA. For example, an organic light-emitting device 310 may be located in the display area DA as shown in FIG. 5. The organic light-emitting device 310 may be located on a planarization layer 170 covering the source electrode 215a and the drain electrode 215b. The planarization layer 170 may planarize or substantially planarize an upper portion of the thin-film transistor 210. The planarization layer 170 may include an organic material, such as acryl, benzocyclobutene (BCB), or hexamethyldisiloxane (HMDSO). Although the planarization layer 170 has a single-layer structure in FIG. 5, various modifications may be made. For example, the planarization layer 170 may have a multi-layered structure. When the display device is the organic light-emitting device 310, the display device may include a pixel electrode 311, a counter electrode 315, and an intermediate layer 313 located between the pixel electrode 311 and the counter electrode 315. The intermediate layer 313 includes an emission layer.

The pixel electrode 311 is electrically connected to the thin-film transistor 210 by contacting one of the source electrode 215a or the drain electrode 215b through an opening portion formed in (e.g., penetrating) the planarization layer 170 or the like as shown in FIG. 5. The pixel electrode 311 includes a light-transmitting conductive layer formed of a light-transmitting conductive oxide, such as ITO, $In_2O_3$, or IZO, and a reflective layer formed of a suitable metal, such as aluminum (Al) or silver (Ag). For example, the pixel electrode 311 may have a three-layered structure including ITO/Ag/ITO.

A pixel-defining film 175 may be located on the planarization layer 170. The pixel-defining film 175 defines a pixel by having an opening corresponding to each sub-pixel, or in other words, an opening through which at least a central portion of the pixel electrode 311 is exposed. Also, as shown in FIG. 5, the pixel-defining film 175 increases a distance between an edge of the pixel electrode 311 and the counter electrode 315 over the pixel electrode 311, to prevent or substantially prevent an arc or the like from occurring on the edge of the pixel electrode 311. The pixel-defining film 175 may include an organic material, such as polyimide or hexamethyldisiloxane (HMDSO).

The intermediate layer 313 of the organic light-emitting device 310 may include a low molecular weight material or a high molecular weight material. When the intermediate layer 313 has a low molecular weight material, the intermediate layer 313 may have a single-layer or multi-layered structure, in which a hole injection layer (HIL), a hole transport layer (HTL), an emission layer (EML), an electron transport layer (ETL), and an electron injection layer (EIL) are stacked, and may be formed by using vacuum deposition. When the intermediate layer 313 includes a high molecular weight material, the intermediate layer 313 may have a structure including an HTL and an EML. In this case, the HTL may include poly(3,4-ethylenedioxythiophene) (PEDOT), and the EML may include a polymer material, such as a polyphenylene vinylene (PPV)-based material or a polyfluorene-based material. The intermediate layer 313 may be formed by using screen printing, inkjet printing, laser-induced thermal imaging (LITI), or the like. The intermediate layer 313 is not necessarily limited thereto, and may have any of various suitable structures. The intermediate layer 313 may include a layer that is integrally formed over a plurality of pixel electrodes 311, or may include a layer that is patterned to correspond to each of the plurality of pixel electrodes 311.

The counter electrode 315 may be located over the display area DA to cover the display area DA. In other words, the counter electrode 315 may be integrally formed in a plurality of organic light-emitting devices, and may correspond to the plurality of pixel electrodes 311. The counter electrode 315 may include a light-transmitting conductive layer formed of ITO, In$_2$O$_3$, or IZO, and may include a semi-transmissive film including a suitable metal, such as Al or Ag. For example, the counter electrode 315 may be a semi-transmissive film including MgAg.

Because each organic light-emitting device may be easily damaged by external moisture, oxygen, or the like, an encapsulation layer may be further provided to cover and protect the organic light-emitting device. The encapsulation layer may cover the display area DA, and may extend to at least a part of the peripheral area PA. The encapsulation layer may include a first inorganic encapsulation layer, an organic encapsulation layer, and a second inorganic encapsulation layer.

The second connection line CL2, the fourth connection line CL4, the sixth connection line CL6, and the eighth connection line CL8 disposed on the second insulating layer, or in other words, on the first gate insulating film 120, may be concurrently (e.g., simultaneously or substantially simultaneously) formed with each other by using the same material as that of the gate electrode 213 disposed on the second insulating layer. The first connection line CL1, the third connection line CL3, the fifth connection line CL5, and the seventh connection line CL7 disposed on the first insulating layer, or in other words, on the second gate insulating film 130 may be concurrently (e.g., simultaneously or substantially simultaneously) formed with each other by using the same material as that of a wiring disposed on the first insulating layer. When desired, the first connection line CL1, the third connection line CL3, the fifth connection line CL5, and the seventh connection line CL7 may be located above the interlayer insulating film 150, and may be concurrently (e.g., simultaneously or substantially simultaneously) formed with each other by using the same material as that of the source electrode 215a and the drain electrode 215b included in the thin-film transistor 210.

A method of checking for defects in a display apparatus by inspecting to determine whether or not there is a short-circuit between connection lines of the display apparatus will be described in more detail hereinafter with reference to FIGS. 6 and 7.

Figure 6:
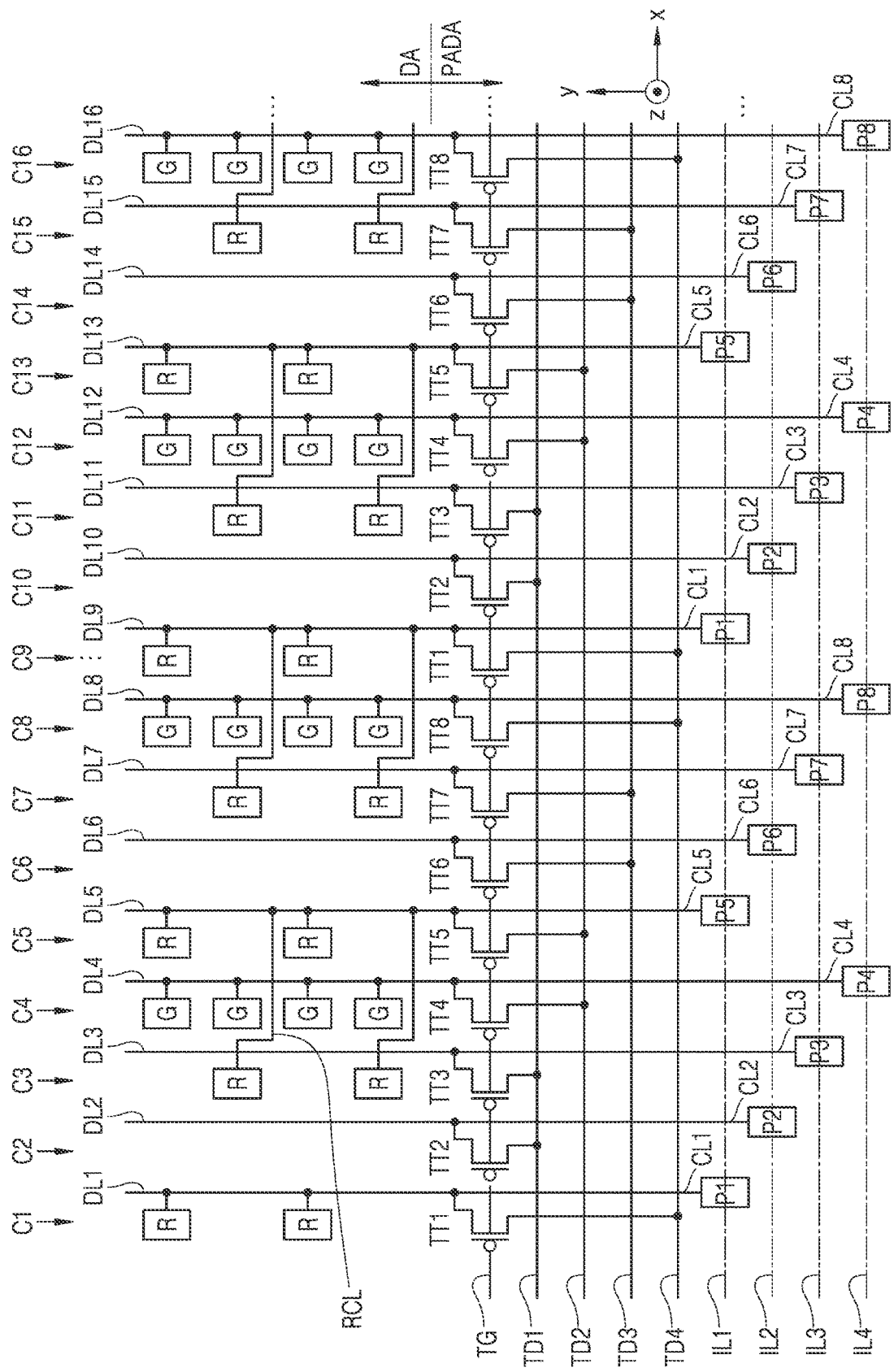
FIG. 6 is a conceptual diagram illustrating a case where the display apparatus of FIG. 1 normally operates when it is inspected to determine whether there is a short-circuit between connection lines of the display apparatus of FIG. 1.

FIG. 6 is a conceptual diagram illustrating a case where the display apparatus of FIG. 1 normally operates when it is inspected to determine whether there is a short-circuit between connection lines of the display apparatus of FIG. 1. In order to inspect to determine whether or not there is a short-circuit between connection lines, a turn-on signal is applied to the test gate line TG to turn on the first test transistor TT1 to the eighth test transistor TT8. In this case, a signal application process is performed by applying a turn-on signal to the second test data line TD2 and the fourth test data line TD4, and applying a turn-off signal to the first test data line TD1 and the third test data line TD3.

When the signals are applied in this way, in a normal display apparatus, as shown in FIG. 6, the red pixels R of the third column C3, the green pixels G of the fourth column C4, and the red pixels R of the fifth column C5 are turned on, and thus, a yellow line or a yellowish orange line, which is similar to a yellow line, extending in the first direction (+y direction) is formed in a portion of the display area DA corresponding to the third column C3 to the fifth column C5. Similarly, a yellow line or a yellowish orange line, which is similar to a yellow line, extending in the first direction (+y direction) is formed in a portion of the display area DA corresponding to the seventh column C7 to the ninth column C9. Black lines extending in the first direction (+y direction) are formed between the yellow lines or the yellowish orange lines.

Accordingly, in a normal display apparatus, the yellow lines (or the yellowish orange lines) and the black lines extending in the first direction (+y direction) are alternately formed along the second direction (+x direction). For reference, because the first column C1 is an outermost column of the display area DA in the second direction (+x direction), only the red pixels R may emit light, and thus, a red line may be formed.

Figure 7:
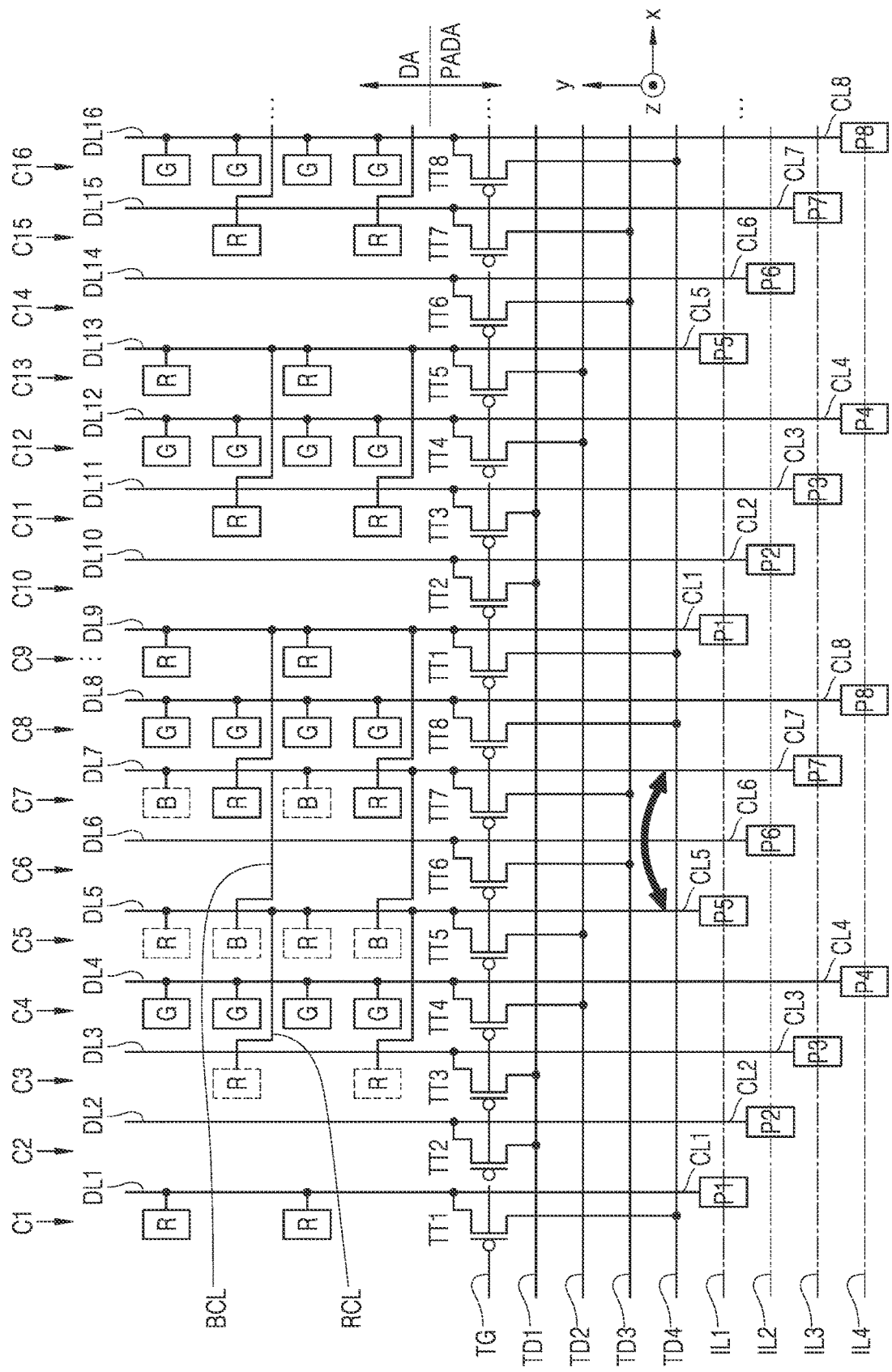
FIG. 7 is a conceptual diagram illustrating a case where the display apparatus of FIG. 1 abnormally operates due to a short-circuit when it is inspected to determine whether there is a short-circuit between connection lines of the display apparatus of FIG. 1.

FIG. 7 is a conceptual diagram illustrating a case where the display apparatus of FIG. 1 abnormally operates due to a short-circuit when it is inspected to determine whether there is a short-circuit between connection lines of the display apparatus of FIG. 1.

Adjacent connection lines from among the connection lines disposed at (e.g., in or on) the same insulating layer as each other may be short-circuited by impurities or the like in a manufacturing process. In FIG. 7, a case where the fifth connection line CL5 and the seventh connection line CL7 disposed on the first insulating layer, or in other words, on the second gate insulating film 130, are short-circuited due to impurities or the like to be electrically connected to each other is illustrated by a black arrow.

In order to inspect to determine whether or not there is a short-circuit between the connection lines as described above, a turn-on signal is applied to the test gate line TG to turn on the first test transistor TT1 to the eighth test transistor TT8. In this case, a signal application process is performed by applying a turn-on signal to the second test data line TD2 and the fourth test data line TD4, and applying a turn-off signal to the first test data line TD1 and the third test data line TD3.

Because the seventh data line DL7 of the seventh column C7 is electrically connected to the third test data line TD3 by the seventh test transistor TT7, the blue pixels B of the seventh column C7 and the blue pixels B of the fifth column C5 electrically connected to the seventh data line DL7 should not emit light in a normal case. However, when the seventh connection line CL7 of the seventh column C7 and the fifth connection line CL5 of the fifth column C5 are short-circuited, a turn-on signal from the second test data line TD2 that is electrically connected to the fifth connection line CL5 of the fifth column C5 is transmitted to the seventh data line DL7 of the seventh column C7 through the fifth data line DL5, the fifth connection line CL5 of the fifth column C5, and the seventh connection line CL7 of the seventh column C7, and thus, the blue pixels B of the seventh column C7 and the blue pixels B of the fifth column C5 emit light. For reference, because a part of an electrical signal applied to the fifth data line DL5 of the fifth column C5 is transmitted to the seventh data line DL7 of the seventh column C7, a luminance of the red pixels R of the fifth column C5 and the red pixels R of the third column C3 that are electrically connected to the fifth data line DL5 is lower than that in a normal case, and the blue pixels B of the seventh column C7 and the blue pixels B of the fifth column C5 that are electrically connected to the seventh data line DL7 also emit light with a low luminance.

As described above with reference to FIG. 6, in a normal display apparatus, during an inspection process, yellow lines (or yellowish orange lines) extending in the first direction (+y direction) and black lines extending in the first direction (+y direction) are alternately formed along the second direction (+x direction). However, as described above with reference to FIG. 7, when a short-circuit occurs between connection wirings, a whitish yellow line, which is similar to a white line, instead of a yellow line or a yellowish orange line is formed in the third column C3 to the fifth column C5, and a whitish yellow line is formed in the seventh column C7 to the ninth column C9. Accordingly, through a process of analyzing an image of a display area to check for defects, it may be reliably determined whether or not there is a short-circuit between at least two connection lines from among the connection lines.

As described above, the first connection line CL1, the third connection line CL3, the fifth connection line CL5, and the seventh connection line CL7 may be disposed on the first insulating layer, or in other words, on the second gate insulating film 130, and the second connection line CL2, the fourth connection line CL4, the sixth connection line CL6, and the eighth connection line CL8 may be disposed on the second insulating layer, or in other words, on the first gate insulating film 120 that is different from the first insulating layer. Accordingly, through a process of analyzing an image, it may be determined whether or not there is a short-circuit between the first connection line CL1, the third connection line CL3, the fifth connection line CL5, and the seventh connection line, or whether or not there is a short-circuit between the second connection line CL2, the fourth connection line CL4, the sixth connection line CL6, and the eighth connection line CL8.

According to one or more embodiments of the present disclosure, a display apparatus capable of accurately and easily checking for defects therein, and a method of checking for defects in the display apparatus may be provided. However, the aspects and features of the present disclosure are not limited thereto.

Although some embodiments have been described, those skilled in the art will readily appreciate that various modifications are possible in the embodiments without departing from the spirit and scope of the present disclosure. It will be understood that descriptions of features or aspects within each embodiment should typically be considered as available for other similar features or aspects in other embodiments, unless otherwise described. Thus, as would be apparent to one of ordinary skill in the art, features, characteristics, and/or elements described in connection with a particular embodiment may be used singly or in combination with features, characteristics, and/or elements described in connection with other embodiments unless otherwise specifically indicated. Therefore, it is to be understood that the foregoing is illustrative of various example embodiments and is not to be construed as limited to the specific embodiments disclosed herein, and that various modifications to the disclosed embodiments, as well as other example embodiments, are intended to be included within the spirit and scope of the present disclosure as defined in the appended claims, and their equivalents.

What is claimed is:

1. A display apparatus comprising:
   a first column comprising blue pixels and red pixels alternately located along a first direction;
   a second column comprising green pixels located along the first direction, the second column being located in a second direction crossing the first direction from the first column;
   a third column comprising red pixels and blue pixels alternately located along the first direction, the third column being located in the second direction from the second column;
   a fourth column comprising green pixels located along the first direction, the fourth column being located in the second direction from the third column;
   a fifth column comprising blue pixels and red pixels alternately located along the first direction, the fifth column being located in the second direction from the fourth column;
   a sixth column comprising green pixels located along the first direction, the sixth column being located in the second direction from the fifth column;
   a seventh column comprising red pixels and blue pixels alternately located along the first direction, the seventh column being located in the second direction from the sixth column;
   an eighth column comprising green pixels located along the first direction, the eighth column being located in the second direction from the seventh column;
   a first test data line extending in the second direction;
   a second test data line extending in the second direction;
   a third test data line extending in the second direction; and
   a fourth test data line extending in the second direction.

2. The display apparatus of claim 1, wherein:
   the blue pixels of the first column are electrically connected to the blue pixels of the third column;
   the red pixels of the third column are electrically connected to the red pixels of the fifth column; and
   the blue pixels of the fifth column are electrically connected to the blue pixels of the seventh column.

3. The display apparatus of claim 2, wherein:
   the green pixels of the second column and the blue pixels of the third column are electrically connected to the first test data line;
   the green pixels of the fourth column and the red pixels of the fifth column are electrically connected to the second test data line;
   the green pixels of the sixth column and the blue pixels of the seventh column are electrically connected to the third test data line; and
   the red pixels of the first column and the green pixels of the eighth column are electrically connected to the fourth test data line.

4. The display apparatus of claim 1, further comprising:
   a first test transistor, one end of the first test transistor being electrically connected to the red pixels of the first column, and another end of the first test transistor being electrically connected to the fourth test data line;
   a second test transistor, one end of the second test transistor being electrically connected to the green pixels of the second column, and another end of the second test transistor being electrically connected to the first test data line;
   a third test transistor, one end of the third test transistor being electrically connected to the blue pixels of the third column, and another end of the third test transistor being electrically connected to the first test data line;
   a fourth test transistor, one end of the fourth test transistor being electrically connected to the green pixels of the fourth column, and another end of the fourth test transistor being electrically connected to the second test data line;
   a fifth test transistor, one end of the fifth test transistor being electrically connected to the red pixels of the fifth column, and another end of the fifth test transistor being electrically connected to the second test data line;
   a sixth test transistor, one end of the sixth test transistor being electrically connected to the green pixels of the sixth column, and another end of the sixth test transistor being electrically connected to the third test data line;

a seventh test transistor, one end of the seventh test transistor being electrically connected to the blue pixels of the seventh column, and another end of the seventh test transistor being electrically connected to the third test data line; and an eighth test transistor, one end of the eighth test transistor being electrically connected to the green pixels of the eighth column, and another end of the eighth test transistor being electrically connected to the first test data line.

5. The display apparatus of claim 4, wherein gate electrodes of the first test transistor to the eighth test transistor are electrically connected to each other.

6. The display apparatus of claim 4, wherein, when an image is displayed in a display area, gate electrodes of the first test transistor to the eighth test transistor are configured to be applied with a turn-off signal.

7. The display apparatus of claim 1, further comprising:
a first pad electrically connected to the red pixels of the first column;
a second pad electrically connected to the green pixels of the second column;
a third pad electrically connected to the blue pixels of the third column;
a fourth pad electrically connected to the green pixels of the fourth column;
a fifth pad electrically connected to the red pixels of the fifth column;
a sixth pad electrically connected to the green pixels of the sixth column;
a seventh pad electrically connected to the blue pixels of the seventh column; and
an eighth pad electrically connected to the green pixels of the eighth column.

8. The display apparatus of claim 7, wherein:
the first pad and the fifth pad are located on a first virtual straight line extending in the second direction;
the second pad and the sixth pad are located on a second virtual straight line extending in the second direction;
the third pad and the seventh pad are located on a third virtual straight line extending in the second direction; and
the fourth pad and the eighth pad are located on a fourth virtual straight line extending in the second direction.

9. The display apparatus of claim 7, further comprising:
a first connection line electrically connecting the red pixels of the first column to the first pad;
a second connection line electrically connecting the green pixels of the second column to the second pad;
a third connection line electrically connecting the blue pixels of the third column to the third pad;
a fourth connection line electrically connecting the green pixels of the fourth column to the fourth pad;
a fifth connection line electrically connecting the red pixels of the fifth column to the fifth pad;
a sixth connection line electrically connecting the green pixels of the sixth column to the sixth pad;
a seventh connection line electrically connecting the blue pixels of the seventh column to the seventh pad; and
an eighth connection line electrically connecting the green pixels of the eighth column to the eighth pad.

10. The display apparatus of claim 9, wherein:
the first connection line, the third connection line, the fifth connection line, and the seventh connection line are located on a first insulating layer; and the second connection line, the fourth connection line, the sixth connection line, and the eighth connection line are located on a second insulating layer different from the first insulating layer.

11. A method of checking for defects in a display apparatus, the method comprising:
preparing a display apparatus comprising:
a first column comprising blue pixels and red pixels alternately located along a first direction;
a second column located in a second direction crossing the first direction from the first column, and comprising green pixels located along the first direction;
a third column located in the second direction from the second column, and comprising red pixels and blue pixels alternately located along the first direction, the blue pixels of the first column being electrically connected to the blue pixels of the third column;
a fourth column located in the second direction from the third column, and comprising green pixels located along the first direction;
a fifth column located in the second direction from the fourth column, and comprising blue pixels and red pixels alternately located along the first direction, the red pixels of the third column being electrically connected to the red pixels of the fifth column;
a sixth column located in the second direction from the fifth column, and comprising green pixels located along the first direction;
a seventh column located in the second direction from the sixth column, and comprising red pixels and blue pixels alternately located along the first direction, the blue pixels of the fifth column being electrically connected to the blue pixels of the seventh column;
an eighth column located in the second direction from the seventh column, and comprising green pixels located along the first direction;
a first test data line extending in the second direction, the green pixels of the second column and the blue pixels of the third column being electrically connected to the first test data line;
a second test data line extending in the second direction, the green pixels of the fourth column and the red pixels of the fifth column being electrically connected to the second test data line;
a third test data line extending in the second direction, the green pixels of the sixth column and the blue pixels of the seventh column being electrically connected to the third test data line; and
a fourth test data line extending in the second direction, the red pixels of the first column and the green pixels of the eight column being electrically connected to the fourth test data line;
applying a turn-on signal to the first test data line and the fourth test data line, and applying a turn-off signal to the second test data line and the third test data line; and
analyzing an image of a display area to check for defects.

12. The method of claim 11, wherein the display apparatus further comprises:
a first test transistor, one end of the first test transistor being electrically connected to the red pixels of the first column, and another end of the first test transistor being electrically connected to the fourth test data line;
a second test transistor, one end of the second test transistor being electrically connected to the green pixels of the second column, and another end of the second test transistor being electrically connected to the first test data line;

a third test transistor, one end of the third test transistor being electrically connected to the blue pixels of the third column, and another end of the third test transistor being electrically connected to the first test data line;

a fourth test transistor, one end of the fourth test transistor being electrically connected to the green pixels of the fourth column, and another end of the fourth test transistor being electrically connected to the second test data line;

a fifth test transistor, one end of the fifth test transistor being electrically connected to the red pixels of the fifth column, and another end of the fifth test transistor being electrically connected to the second test data line;

a sixth test transistor, one end of the sixth test transistor being electrically connected to the green pixels of the sixth column, and another end of the sixth test transistor being electrically connected to the third test data line;

a seventh test transistor, one end of the seventh test transistor being electrically connected to the blue pixels of the seventh column, and another end of the seventh test transistor being electrically connected to the third test data line; and an eighth test transistor, one end of the eighth test transistor being electrically connected to the green pixels of the eighth column, and another end of the eighth test transistor being electrically connected to the first test data line, and wherein the applying of the turn-on signal and the turn-off signal is performed in a state where the first test transistor to the eighth test transistor are turned on.

13. The method of claim 12, wherein gate electrodes of the first test transistor to the eighth test transistor are electrically connected to each other.

14. The method of claim 11, wherein the display apparatus further comprises:

a first pad electrically connected to the red pixels of the first column;

a second pad electrically connected to the green pixels of the second column;

a third pad electrically connected to the blue pixels of the third column;

a fourth pad electrically connected to the green pixels of the fourth column;

a fifth pad electrically connected to the red pixels of the fifth column;

a sixth pad electrically connected to the green pixels of the sixth column;

a seventh pad electrically connected to the blue pixels of the seventh column; and an eighth pad electrically connected to the green pixels of the eighth column, and wherein the analyzing of the image comprises checking to determine whether or not there is a short-circuit between at least two pads from among the first pad to the eighth pad.

15. The method of claim 14, wherein:

the first pad and the fifth pad are located on a first virtual straight line extending in the second direction;

the second pad and the sixth pad are located on a second virtual straight line extending in the second direction;

the third pad and the seventh pad are located on a third virtual straight line extending in the second direction;

the fourth pad and the eighth pad are located on a fourth virtual straight line extending in the second direction; and the analyzing of the image comprises checking to determine whether or not there is a short-circuit between pads located on a same virtual straight line in the second direction from among the first pad to the eight pad.

16. A method of checking for defects in a display apparatus, the method comprising:

preparing a display apparatus comprising:

a first column in which blue pixels and red pixels are alternately arranged along a first direction;

a second column that is located in a second direction crossing the first direction from the first column, and in which green pixels are arranged along the first direction;

a third column that is located in the second direction from the second column, and in which red pixels and blue pixels are alternately arranged along the first direction;

a fourth column that is located in the second direction from the third column, and in which green pixels are arranged along the first direction;

a fifth column that is located in the second direction from the fourth column, and in which blue pixels and red pixels are alternately arranged along the first direction;

a sixth column that is located in the second direction from the fifth column, and in which green pixels are arranged along the first direction;

a seventh column that is located in the second direction from the sixth column, and in which red pixels and blue pixels are alternately arranged along the first direction;

an eighth column that is located in the second direction from the seventh column, and in which green pixels are arranged along the first direction;

a first test data line extending in the second direction;

a second test data line extending in the second direction;

a third test data line extending in the second direction; and a fourth test data line extending in the second direction;

applying a turn-on signal to the second test data line and the fourth test data line, and applying a turn-off signal to the first test data line and the third test data line; and analyzing an image of a display area to check for defects, wherein:

the blue pixels of the first column are electrically connected to the blue pixels of the third column;

the red pixels of the third column are electrically connected to the red pixels of the fifth column;

the blue pixels of the fifth column are electrically connected to the blue pixels of the seventh column;

the green pixels of the second column and the blue pixels of the third column are electrically connected to the first test data line;

the green pixels of the fourth column and the red pixels of the fifth column are electrically connected to the second test data line;

the green pixels of the sixth column and the blue pixels of the seventh column are electrically connected to the third test data line; and the red pixels of the first column and the green pixels of the eight column are electrically connected to the fourth test data line.

17. The method of claim 16, wherein the display apparatus further comprises:

a first test transistor having one end electrically connected to the red pixels of the first column, and another end electrically connected to the fourth test data line;

a second test transistor having one end electrically connected to the green pixels of the second column, and another end electrically connected to the first test data line;

a third test transistor having one end electrically connected to the blue pixels of the third column, and another end electrically connected to the first test data line;

a fourth test transistor having one end electrically connected to the green pixels of the fourth column, and another end electrically connected to the second test data line;

a fifth test transistor having one end electrically connected to the red pixels of the fifth column, and another end electrically connected to the second test data line;

a sixth test transistor having one end electrically connected to the green pixels of the sixth column, and another end electrically connected to the third test data line;

a seventh test transistor having one end electrically connected to the blue pixels of the seventh column, and another end electrically connected to the third test data line; and an eighth test transistor having one end electrically connected to the green pixels of the eighth column, and another end electrically connected to the first test data line, wherein the applying of the turn-on signal and the turn-off signal is performed in a state where the first test transistor to the eighth test transistor are turned on.

18. The method of claim 17, wherein gate electrodes of the first test transistor to the eighth test transistor are electrically connected to each other.

19. The method of claim 16, wherein the display apparatus further comprises:

a first connection line electrically connecting the red pixels of the first column to a first pad;

a second connection line electrically connecting the green pixels of the second column to a second pad;

a third connection line electrically connecting the blue pixels of the third column to a third pad;

a fourth connection line electrically connecting the green pixels of the fourth column to a fourth pad;

a fifth connection line electrically connecting the red pixels of the fifth column to a fifth pad;

a sixth connection line electrically connecting the green pixels of the sixth column to a sixth pad;

a seventh connection line electrically connecting the blue pixels of the seventh column to a seventh pad; and an eighth connection line electrically connecting the green pixels of the eighth column to an eighth pad, wherein the analyzing of the image comprises checking to determine whether or not there is a short-circuit between at least two connection lines from among the first connection line to the eighth connection line.

20. The method of claim 19, wherein:

the first connection line, the third connection line, the fifth connection line, and the seventh connection line are located on a first insulating layer;

the second connection line, the fourth connection line, the sixth connection line, and the eighth connection line are located on a second insulating layer different from the first insulating layer; and the analyzing of the image comprises checking to determine whether or not there is a short-circuit between the first connection line, the third connection line, the fifth connection line, and the seventh connection line, or whether or not there is a short-circuit between the second connection line, the fourth connection line, the sixth connection line, and the eighth connection line.

* * * * *